(12) United States Patent
Hutcheson

(10) Patent No.: US 7,037,799 B2
(45) Date of Patent: May 2, 2006

(54) BREAKDOWN VOLTAGE ADJUSTMENT FOR BIPOLAR TRANSISTORS

(75) Inventor: Billy Bradford Hutcheson, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 10/280,931

(22) Filed: Oct. 24, 2002

(65) Prior Publication Data

US 2004/0082136 A1    Apr. 29, 2004

(51) Int. Cl.
*H01L 21/331* (2006.01)

(52) U.S. Cl. ............. 438/350; 438/312; 438/314; 438/320; 438/342

(58) Field of Classification Search ........... 438/350, 438/312, 314, 320, 342
See application file for complete search history.

(56) References Cited

U.S. PATENT DOCUMENTS

| | | | | |
|---|---|---|---|---|
| 4,151,009 A | * | 4/1979 | Ogureck et al. | 438/309 |
| 4,178,190 A | * | 12/1979 | Polinsky | 438/340 |
| 4,868,135 A | | 9/1989 | Ogura et al. | |
| 5,011,784 A | * | 4/1991 | Ratnakumar | 438/203 |
| 5,099,303 A | * | 3/1992 | Kato | 257/370 |
| 5,273,915 A | * | 12/1993 | Hwang et al. | 438/155 |
| 5,569,612 A | * | 10/1996 | Frisina et al. | 438/350 |
| 5,648,281 A | | 7/1997 | Williams et al. | |
| 2002/0058373 A1 | * | 5/2002 | Shen et al. | 438/202 |
| 2003/0183903 A1 | * | 10/2003 | Ikeda | 257/566 |
| 2004/0051148 A1 | * | 3/2004 | Johnson et al. | 257/378 |

* cited by examiner

*Primary Examiner*—Jennifer Kennedy
(74) *Attorney, Agent, or Firm*—Jacqueline J. Garner; W. James Brady, III; Frederick J. Telecky, Jr.

(57) ABSTRACT

Devices and methods are disclosed related to a bipolar transistor device and methods of fabrication. A top region is formed at a surface of and within a base region. The top region is formed by implanting a dopant of an opposite conductivity to that of the base region. However, the top region remains of the same conductivity type as the base region (e.g., n-type or p-type). This implanting, also referred to as counterdoping, increases resistivity of the top region and thus improves an emitter-base breakdown voltage. Additionally, this implanting does not have a substantial detrimental affect on a beta value, also referred to as an amplification property, or a collector emitter breakdown voltage, also referred to as BVceo, for the transistor. The beta value and the collector emitter breakdown voltage are mainly a function of a bottom portion of the base region.

13 Claims, 15 Drawing Sheets

BREAKDOWN VOLTAGE ADJUSTMENT FOR BIPOLAR TRANSISTORS

FIELD OF INVENTION

The present invention relates generally to semiconductor devices and more particularly to devices and methods that modify/adjust breakdown voltages in bipolar transistor devices.

BACKGROUND OF THE INVENTION

Bipolar transistors are commonly used in semiconductor devices, especially for high speed operation and large drive current applications. FIG. 1 depicts a conventional bipolar transistor 100. The transistor 100 is shown with a collector region 104 formed in a substrate 102. The collector region 104 is typically a lightly doped epitaxial layer of one conductivity type. A base region 106 is formed in the collector region 104 and has an opposite conductivity type from the collector region 104. An emitter region 108 is formed within the base region 106 and has the same conductivity type as the collector region 104. A collector contact 110, a base contact 112 and an emitter contact 114 are formed on/in the collector region 104, the base region 106 and the emitter region 108, respectively.

For the conventional bipolar transistor 100, electrons flow (and thus current) from the emitter region 108, through the base region 106 to the collector region 110 during normal operation. When there is no current to the base region 106, the transistor 100 is turned off. However, only a relatively small current to the base region 106 causes the transistor 100 to be turned on. The size of the base current regulates the larger amount of current flowing through the transistor, referred to as the collector current, which flows primarily from the emitter region 108 to the collector region 110. There is an amplification effect of the base current to the collector current. The base current has the effect of modifying the resistance of the base region 106. During operation, both negative and positive currents flow through the base region.

The amplification property of the base current to the collector current is referred to as gain, beta, and transistor Hfe. Numerically, the beta is the result of dividing the collector current by the base current. Typical values of beta for DC current gain are generally on the order of 10–200.

The beta value for a given bipolar transistor is generally a design specific parameter for a particular application. However, a desired beta value can often be at odds with a goal of reducing semiconductor device dimensions. Generally, to increase the number of devices per die, it is desirable to reduce depths of the various active regions of the bipolar device (e.g., collector region 104, base region 106, and emitter region 108), which can be counter to achieving a desired beta value.

In addition to influencing beta values, shrinking bipolar transistor device dimensions can also introduce breakdown voltage problems. A breakdown voltage is a voltage value wherein a "breakdown" of a device occurs that results in a short circuit type condition between two or more regions or portions of a device. This short circuit type condition is generally undesirable and can result in significant damage to a semiconductor device, for example, due to high current densities. Generally, it is desirable to have a relatively large breakdown voltage so as to avoid this breakdown effect.

What are needed are bipolar transistor device(s) and/or methods of fabricating such a device that mitigate breakdown voltages while shrinking device dimensions and yet maintaining desired beta values.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to semiconductor fabrication and, more particularly, to bipolar transistor device fabrication. A top region is formed at a surface of and within a base region. The top region is formed by implanting a dopant of an opposite conductivity to that of the base region. However, the top region remains of the same conductivity type as the base region (e.g., n-type or p-type). This implanting, also referred to as counterdoping, increases a resistivity of the top region and thus improves an emitter-base breakdown voltage. Additionally, this implanting does not have a substantial detrimental effect on a beta value for the transistor, also referred to as an amplification property or Hfe and does not have a substantial detrimental effect on a collector emitter breakdown voltage, also referred to as BVceo. The beta value and the collector emitter breakdown voltage are substantially a function of a bottom portion of the base region, which is not affected by the counterdoping.

In one aspect of the invention, a bipolar transistor is described. The bipolar transistor includes a collector region, a base region and an emitter region. The collector region is of a first conductivity type (e.g., n-type or p-type conductivity). The base region is located within the collector region and is of a second conductivity type that is opposite of the first conductivity type. Generally, the top region is formed by lightly counterdoping the base region with a dopant of an opposite conductivity type than the base region. The emitter region is located within the base region and, like the collector region, is of the first conductivity type. Other devices and methods are disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
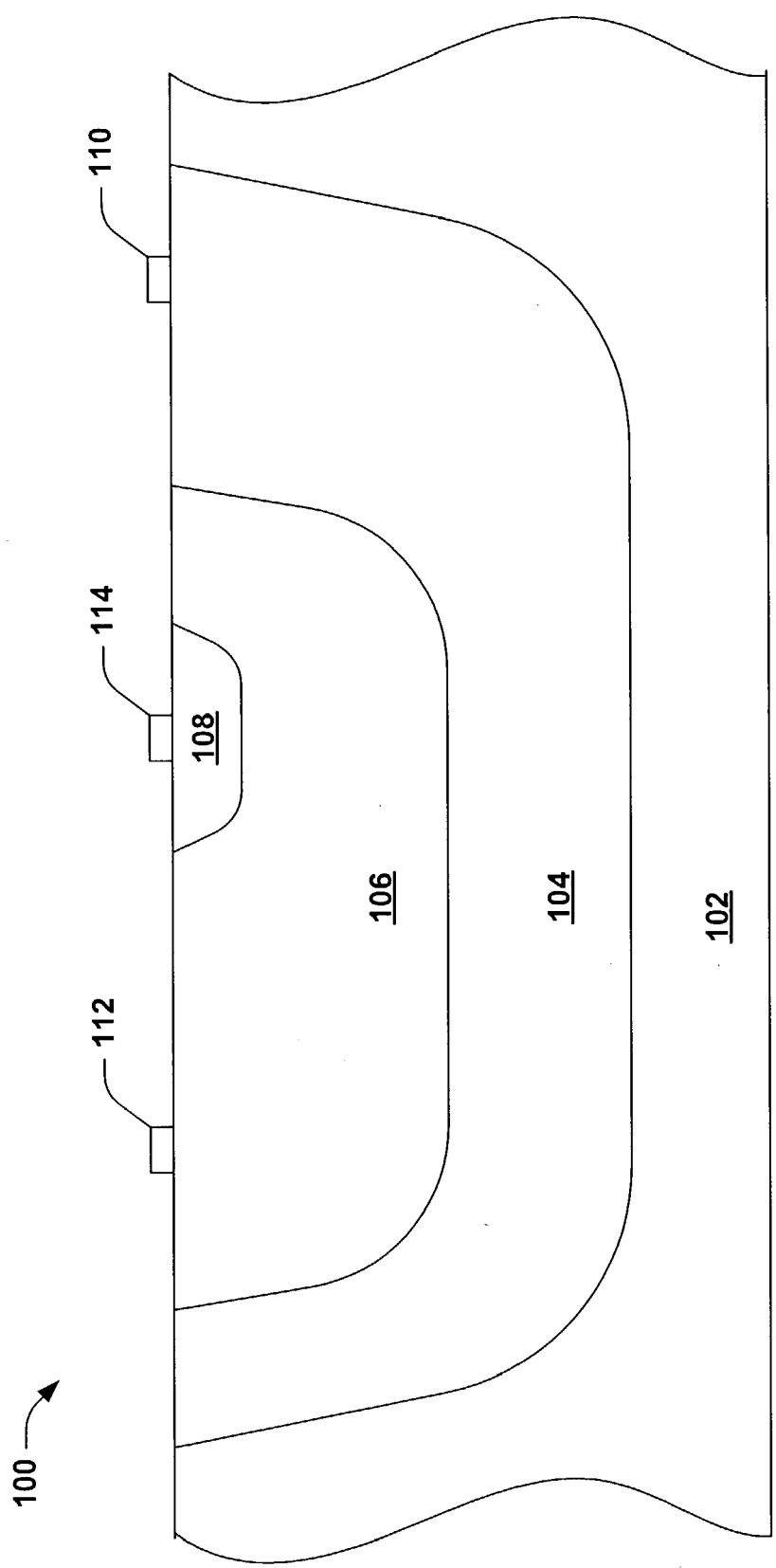
FIG. 1 is a cross sectional view of a conventional bipolar transistor.
Figure 2:
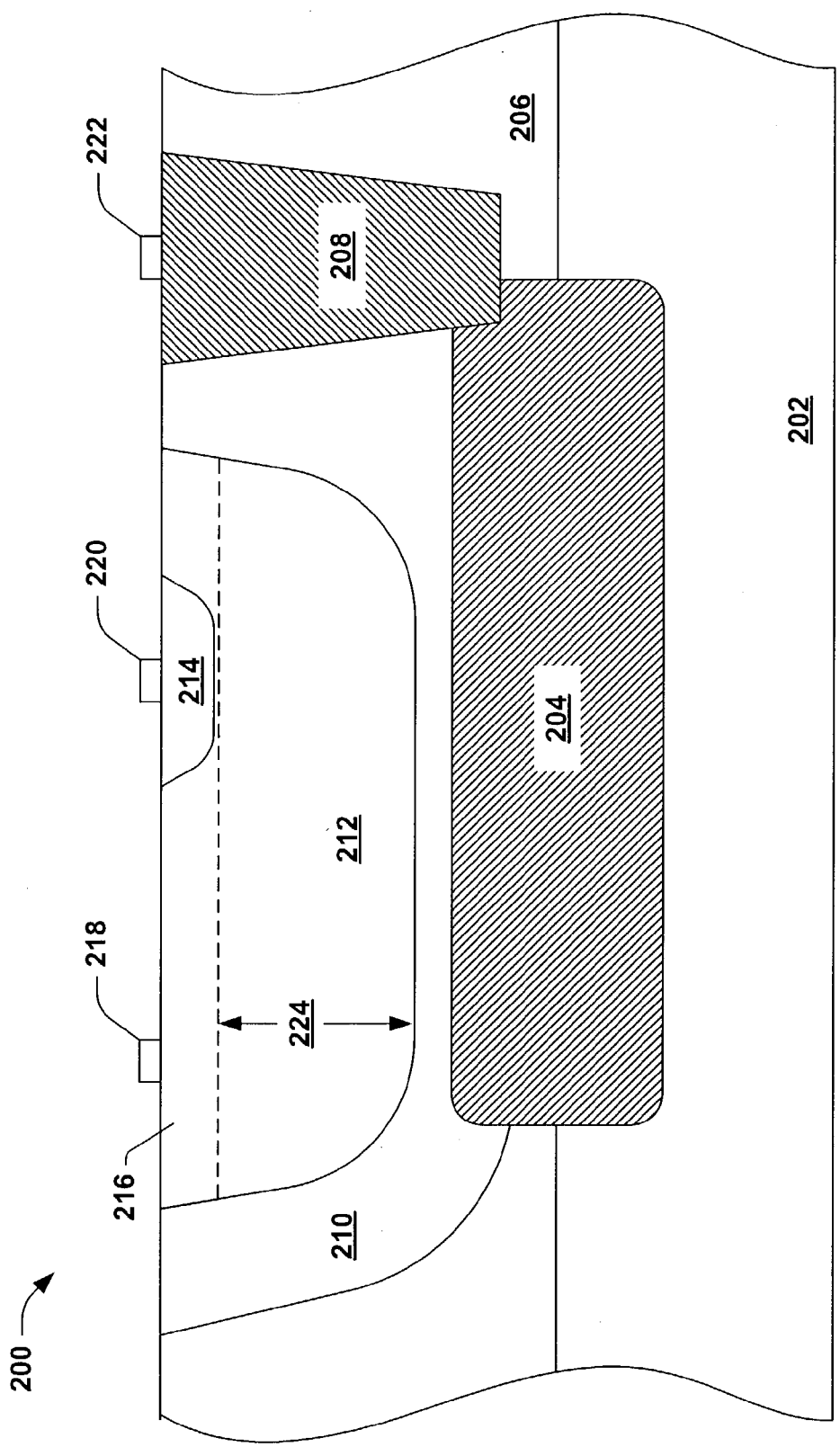
FIG. 2 is a cross sectional view of a bipolar transistor in accordance with an aspect of the present invention.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter. In one aspect of the invention, a counter doped region is formed at a surface of and within a base region. The counter doped region is formed by implanting a dopant of an opposite conductivity to that of the base region. However, the counter doped region remains of the same conductivity type as the base region (e.g., n-type or p-type). This implanting does not have a substantial detrimental effect on a beta value for the transistor, also referred to as an amplification property or Hfe and does not have a substantial detrimental effect on a collector emitter breakdown voltage, also referred to as BVceo. The beta value and the collector emitter breakdown voltage are substantially a function of a bottom portion of the base region, which is not affected by the counterdoping. Beginning with FIG. 2, a cross sectional view of a bipolar transistor device 200 in accordance with an aspect of the present invention is illustrated. The device 200 is able to yield a desired beta value for amplification purposes and maintain a suitably large breakdown voltage. The exemplary device 200 includes a substrate 202, a buried layer 204, an epitaxial layer 206, a deep collector region 208, a collector region 210, a base region 212, an emitter region 214 and a top region 216 associated with the base region 212. A base contact 218 provides an electrical connection to the base region through the top region 216, an emitter contact 220 provides an electrical connection to the emitter region 214 and a collector contact 222 provides an electrical connection to the collector region 210 through the deep collector region 208.

The substrate 202 is comprised of a semiconductor material, such as lightly doped p-type silicon, and has one or more semiconductor layers associated therewith. The one or more semiconductor layers can include, for example, a semiconductor material inherent in a wafer or a semiconductor layer grown via a growth process, a semiconductor layer deposited via a suitable deposition technique and the like. The one or more semiconductor layers may include doped and un-doped semiconductor materials.

The buried layer 204 is formed in the substrate 202 and, subsequently, in the epitaxial layer 206. The buried layer 204 is formed by doping or implanting an n-type dopant such as, antimony, arsenic, and phosphorous, into the substrate 202 according to a specified dose or concentration (e.g., for an NPN type bipolar transistor device). In such cases where the buried layer 204 is doped with an n-type dopant, the buried layer 204 can also be referred to as an n-buried layer (NBL). During and/or after formation of the epitaxial layer 206, the n-type dopant out-diffuses into the epitaxial layer 206, thereby expanding a vertical size of the buried layer 204. Generally, the buried layer 204 defines a channel for carrying collector current of the bipolar transistor device 200. An exemplary value for a doping dosage for the buried layer 204 is about $5 \times 10^{15}$ ions/cm$^2$. After diffusion, concentration remains at about $5 \times 10^{19}$ ions/cm$^3$.

The epitaxial layer 206, in this example, is a p-type single-crystal semiconductor layer or film grown from the substrate 202. One suitable means for growing the epitaxial layer 206 is to deposit silicon atoms on a silicon wafer in a chemical vapor deposition reactor. The depositing atoms arrive at a substrate surface with sufficient energy to move around on the substrate surface and orient themselves to the crystal arrangement of the atoms of the substrate 202. The epitaxial layer 206 can improve the precision and concentration range of doping procedures and doped region formation.

The deep collector region 208 is formed in the epitaxial layer 206 to a depth such that it is substantially in contact with the buried layer 204. The deep collector region 208, like the buried layer 204, is doped with an n-type dopant. However, the deep collector region 208 can be formed with an even higher concentration or dose than the buried layer 204. Essentially, the deep collector region 208 provides a low resistance path from the collector contact 222 to the buried layer 204.

The collector region 210 is also located and formed in the epitaxial layer 206 and is substantially in contact with the buried layer 204 and the deep collector region 208. Additionally, the collector region is doped with an n-type of material but is generally with a lower concentration than the deep collector region 208. The base region 212 is located and formed within the collector region 210. The base region 212 is formed with a higher dopant concentration than the collector region 210 and is doped with a p-type material such as boron. By this doping, the base region 212 becomes a p-type region. The emitter region 214 is located and formed within the base region 212. The emitter region 214 is formed by doping or implanting an n-type dopant with a higher dopant concentration or dose than the base region 212. This doping concentration is sufficient to make the emitter region an n-type region.

The top region 216 is a shallow region formed within the base region 212 at its surface. The top region 216 of the base region 212 (which is p-type) is relatively lightly counter-doped with an n-type material, but remains a p-type region. Because of this counter doping, the resistivity of the top region is increased to become more like other areas of the base region 212. Thus, a greater value for a breakdown voltage between the emitter region 214 and the base region 212 is obtained than is obtained for conventional bipolar transistor devices without such a top region. Additionally, the top region 216 has only a minor impact on the beta value or amplification properties of the bipolar transistor device 200. The beta value is substantially a function of a bottom portion 224 of the base region 212, which includes the p-type concentration of the dose or dopant employed in the original base implant. Prior to counter doping, the top region 216 has a concentration value such as, about $5 \times 10^{17}$ ions/cm$^3$. After counter doping, the top region 216 has a lower concentration value, such as, for example, $4.5 \times 10^{17}$ ions/cm$^3$. The bottom portion 224 of the base region 212 is not counterdoped and can have a concentration value lower than the top region 216, such as, for example, about $5 \times 10^{16}$ ions/cm$^3$, depending on the concentration profile for the base region 212.

For the bipolar transistor device 200, current flows (i.e., electrons flow) from the emitter region 214, through the base region 212 to the collector region 210 during normal operation. When there is no current to the base region 212, the transistor 200 is turned "off". However, only a relatively small current to the base region 212 causes the transistor 200 to be turned on. The size of the base current regulates the larger amount of current flowing through the transistor, referred to as the collector current, which flows from the emitter region 214 to the collector region 210. There is an amplification effect of the base current to the collector current. The base current has the effect of modifying the resistance of the base region 212. During operation, both negative and positive currents flow through the base region.

The performance characteristics of the bipolar transistor device 200 include emitter-base breakdown voltage, beta value and the like. Various design parameters such as depth of regions, dimensions, concentrations, concentration profiles, dopant selection, and the like impact the performance characteristics of the transistor 200. Therefore, the regions of the transistor 200 are doped or implanted at dosages to obtain desired concentrations. A variety of suitable concentrations and dosages can be employed in accordance with the present invention. For example, the base region 212 can be implanted or doped with an exemplary dose of about $1 \times 10^{13}$ ions/cm$^2$ and the top region 216 can be implanted with a dosage of about $1 \times 10^{12}$ ions/cm$^2$, to provide a suitable emitter-base breakdown voltage without substantially detrimentally affecting the beta value for the transistor 200. These exemplary dosages result in a bottom portion of the base region dopant concentration of about $5 \times 10^{16}$ ions/cm$^3$ and a top region of the base region dopant concentration of about $4.5 \times 10^{17}$ ions/cm$^3$. As stated supra, prior to counterdoping, the top region has a concentration value such as, about $5 \times 10^{17}$ ions/cm$^3$.

The regions of the transistor device 200 are typically doped via ion implantation. Ion implantation is a process in which ions are selectively and physically implanted into the substrate or desired region. For a typical ion implantation process, dopant ions are accelerated according to an energy level so as to have a particular velocity. The accelerated ions then strike a surface and penetrate to a depth that is a function of the energy level. Unlike diffusion, dopants implanted via ion implantation do not generally diffuse laterally upon their implantation. Additionally, with ion implantation, dopants can be implanted with greater control over their concentration profile than with diffusion.

As described, the bipolar transistor device 200 is a NPN type transistor. However, it is appreciated that the respective regions can be fabricated with opposite conductivity types in order to yield a PNP type transistor in accordance with the present invention. Additionally, variations of the transistor device 200 such as, not employing a deep collector region, are included in the present invention.

Figure 3:
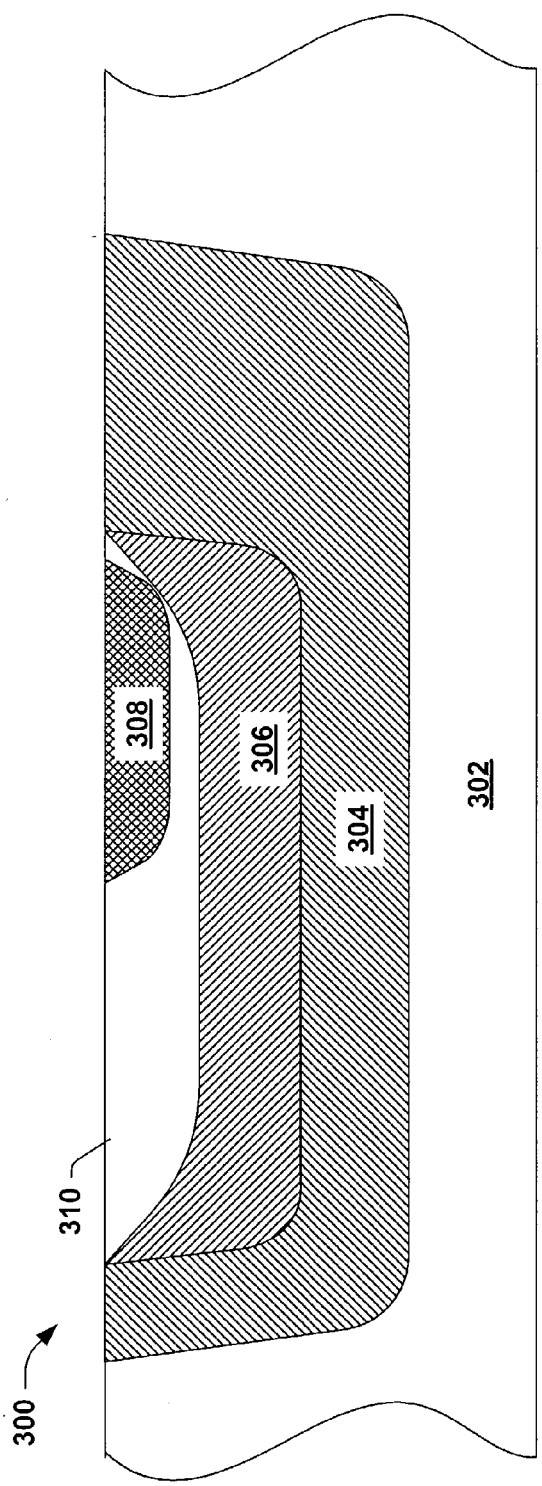
FIG. 3 is a cross sectional view of a bipolar transistor in accordance with an aspect of the present invention.

FIG. 3 depicts a cross sectional view of a bipolar transistor device 300 in accordance with another aspect of the present invention. The device 300 includes a substrate 302, a collector region 304, a base region 306, an emitter region 308 and a top region 310.

The substrate 302 is comprised of a semiconductor material such as silicon. The substrate 302 is typically an upper portion of a wafer. Additionally, at least a portion of the substrate 302 can be an epitaxial layer grown by a suitable epitaxial process. The collector region 304 is formed in the substrate 302. The collector region 304 is of a first type of conductivity. A base region 306 is shown formed in the collector region 304. The base region 304 has a second conductivity type that is opposite the first conductivity type. An emitter region 308 is shown as being formed in the base region 306. Like the collector region 304, the emitter region 308 is also of the first conductivity type.

The top region 310 is formed within the base region 306. The top region 310 is a shallow region that is formed by lightly counterdoping a portion of the base region 306 with a dopant of the first conductivity type. However, the top region 310 formed by this counterdoping maintains its second conductivity type despite the counterdoping. This maintaining of conductivity type can be achieved by counterdoping the second conductivity type with less dopant than was employed to dope the base region with a dopant of the first conductivity type. The top region 310 has an increased resistivity as compared with the remaining portion of the base region and, thus, increases the breakdown voltage from the emitter region 308 to the base region 306.

Figure 4:
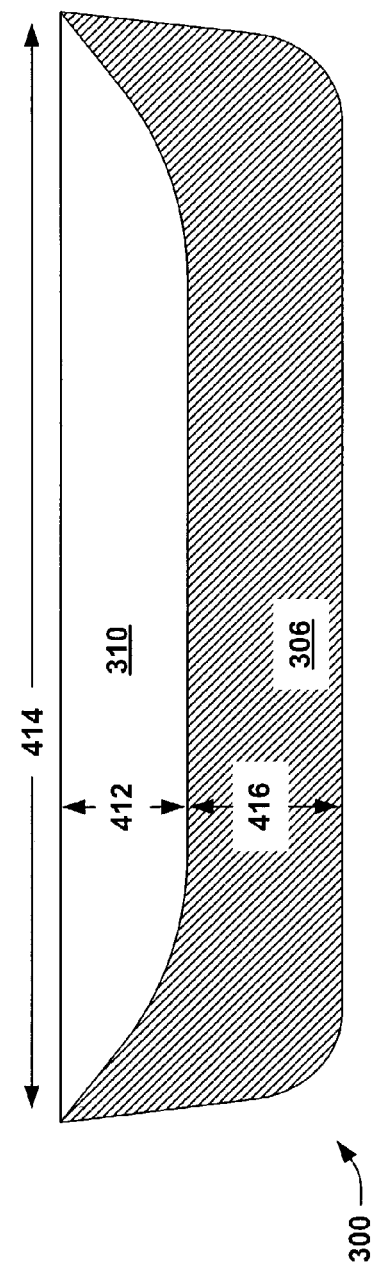
FIG. 4 is a cross sectional view of a base region in accordance with an aspect of the present invention.

FIG. 4 further illustrates the transistor device 300, wherein another cross sectional view of the base portion of the bipolar transistor device 300 is depicted. A depth 412 and width 414 of the top region 310 is shown. In contrast, a depth or thickness 416 of a bottom portion of the base region 306 is also shown. The depth 412 of the top region is generally substantially less than the thickness 416 of the bottom portion of the base region. Some exemplary values for the depth 412 of the top region and the thickness 416 of the bottom portion are 1500A and 5000A, respectively. Additionally, one suitable, exemplary ratio of the top region to the bottom portion is 0.3, however, other depth ratios may be employed and are contemplated as falling within the scope of the present invention.

Figure 5:
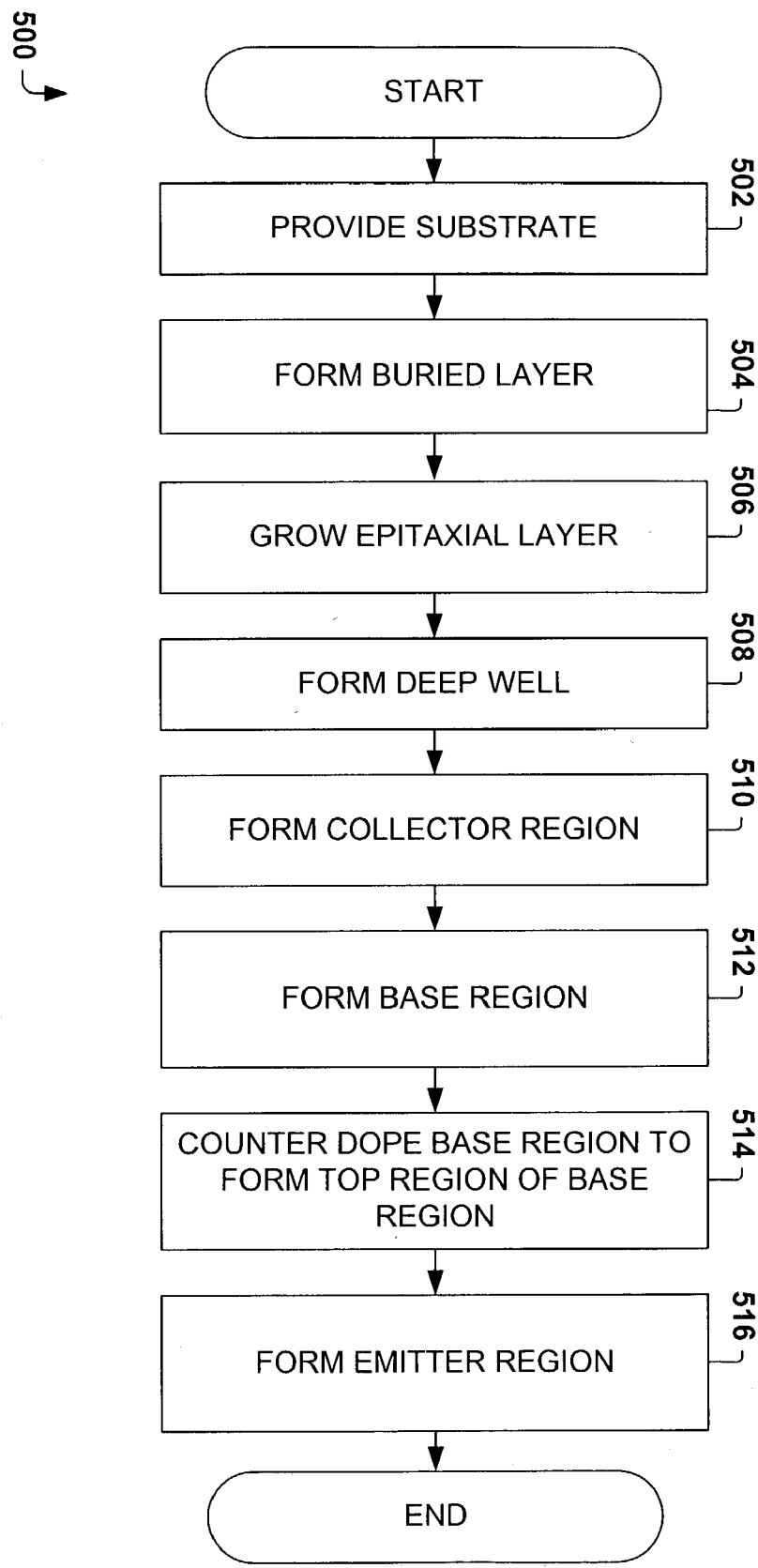
FIG. 5 is a flow diagram illustrating a method of fabricating a bipolar transistor in accordance with an aspect of the present invention.
Figure 6:
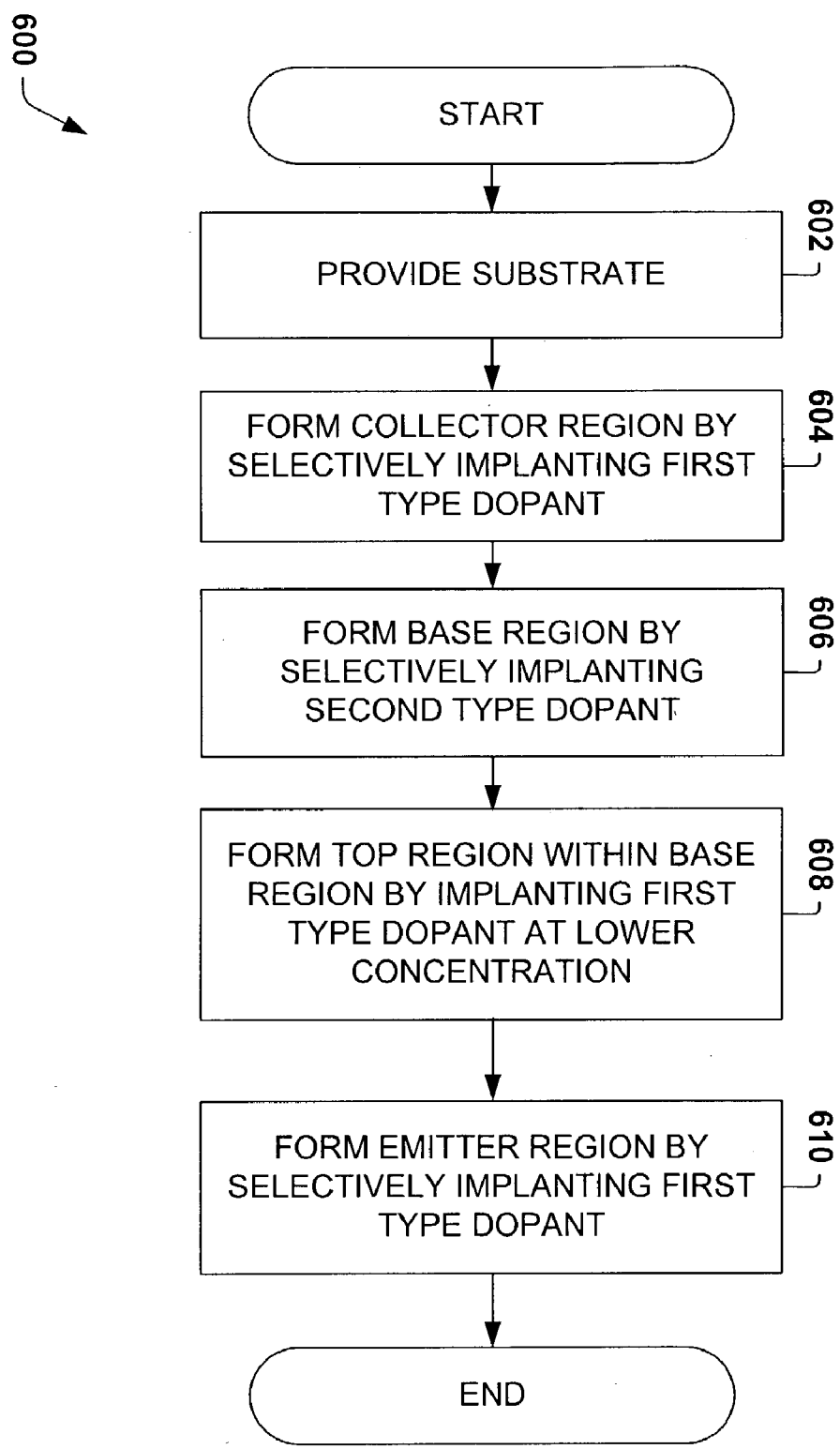
FIG. 6 is a flow diagram illustrating a method of fabricating a bipolar transistor in accordance with an aspect of the present invention.

In view of the foregoing structural and functional features described supra and infra, methodologies in accordance with various aspects of the present invention will be better appreciated with reference to FIGS. 5–6. While, for purposes of simplicity of explanation, the methodologies of FIGS. 5–6 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Turning now to FIG. 5, a flow diagram of a method 500 of fabricating a bipolar transistor device in accordance with an aspect of the present invention is depicted in accordance with an exemplary BiCMOS process. The device fabricated by the method 500 is able to have a desired/selected beta value along with a relatively high or improved emitter-base breakdown voltage as compared to conventional bipolar transistor devices without requiring an additional mask.

The method 500 begins at block 502 where a substrate comprising a semiconductor or having at least one semiconductor layer is provided. The substrate includes a doped and undoped wafer (e.g., silicon wafer, silicon wafer lightly doped with a p-type material, and the like) and is typically an upper surface of a wafer. The method 500 continues at block 504 where an n-type dopant is selectively implanted into the substrate and forms a buried layer. Suitable n-type dopants for silicon include antimony, arsenic, and phosphorous. For a typical ion implantation process, dopant ions are accelerated according to an energy level so as to have a particular velocity. The accelerated ions then strike a surface and penetrate to a depth that is a function of the energy level. Unlike diffusion, dopants implanted via ion implantation do not generally substantially diffuse laterally. Additionally, dopants can be implanted with greater control over their concentration profile. Although ion implantation can be employed with the present invention, it is appreciated that other suitable mechanisms can be employed to form the buried layer and still be in accordance with the present invention.

Then, an epitaxial layer is grown over the substrate at block 506. The epitaxial layer is grown by depositing atoms on the substrate surface with sufficient energy to move around on the substrate surface and orient themselves into the crystal arrangement of the atoms of the substrate. The epitaxial layer can be grown as a p-type layer by including a p-type dopant during the growing process. In addition to growing the epitaxial layer, further diffusion of the n-type material occurs widening the buried layer. An isolation layer (e.g., a field oxide) can be formed over the epitaxial layer and patterned.

An n-type dopant is, subsequent to growing the epitaxial layer, selectively implanted over the buried layer into the epitaxial layer forming a deep collector region at block 508. The deep collector region is generally formed so as to be in contact with the buried layer. A relatively high dose of n-type material is employed to form the deep collector region so that the deep collector region is highly n-type. Thus, the deep collector region is able to provide a low resistance path to the buried layer. Continuing at block 510, a collector region is formed by selectively implanting an n-type material. In a BiCMOS type process, the implantation to form the collector region may be the same process or procedure employed to form deep n-well regions for fabrication of PMOS transistors therein. The collector region is formed over the buried layer and adjacent to the deep collector region.

Continuing at block 512, a base region is formed within the collector region by selectively implanting a p-type material. The material is implanted with a higher concentration than that of the n-type material employed in forming the collector region. Thus, the overall conductivity of the base region is p-type. Additionally, the p-type material is implanted and diffused in such a way that the base region has a smaller depth (e.g., is shallower) than the collector region. A suitable dopant that can be utilized for the base region is boron.

Continuing with the method 500 at block 514, a top region is formed in the base region by selectively implanting an n-type material to a concentration such that the top region remains of the same conductivity type as the base region, which at present is p-type. Such a top region can also be referred to as a counter doped region. Additionally, such implantation of a dopant without changing the conductivity type can also be referred to as counter doping. The implantation for the top region is performed at a lower energy and/or velocity such that the top region is shallower than the base region. Furthermore, the top region is generally substantially shallower than the base region. This depth of the top region is selected so as to reduce the impact of the increased resistivity of the top region on the beta value for the transistor device while improving and/or stabilizing the breakdown voltage between the emitter and the base regions. Additionally, it is appreciated that the top region can be formed prior to formation of the emitter region without incurring an additional masking operation. That is, the masking layer employed to define the base region at 512 is also employed at 514 such that the improved transistor breakdown performance associated therewith may be advantageously achieved without any additional masks or mask steps.

Some exemplary dopant concentrations are $4.5 \times 10^{17}$ ions/$cm^3$ for the top region, which would otherwise have a dopant concentration of about $5.0 \times 10^{17}$ ions/$cm^3$ without the counter doping.

Subsequent to forming the base region, an emitter region is formed within the base region by selectively implanting an n-type material at block 516. This n-type material is implanted with a higher concentration than that of the p-type material in the base region. Thus, the emitter region is of an n-type conductivity. Additionally, the n-type material for the emitter region is implanted and diffused in such a way that the depth of the emitter region is less than the depth of the base region.

In a BiCMOS process, the emitter region may be formed concurrently with n-type source/drain regions for NMOS devices elsewhere on the substrate (sometimes referred to as an NSD implant). Additionally, in a BiCMOS process, the base region formation process may comprise a shallow p-well that is also utilized for NMOS well or PMOS drain extensions, for example.

Other additional structures and layers can be formed for the transistor device. A metal level oxide layer can be formed over the device and conductive plugs can be formed through the metal level oxide layer so as to provide conductive contacts to the various regions of the transistor device. Although the method 500 specifically describes fabrication of an NPN type bipolar transistor device, it is appreciated that variations of the method 500 are indeed contemplated by the present invention and that such variations include fabrication of PNP type bipolar transistor devices.

FIG. 6 is a flow diagram of a method 600 of forming a top region within a base region in accordance with another aspect of the present invention. The top region improves the emitter-base breakdown voltage without causing a significant detrimental affect to the beta value.

Beginning at block 602, a semiconductor substrate is provided. The substrate can comprise one or more semiconductor layers and be doped or undoped. The substrate can be, for example, a silicon wafer. Subsequently, a collector region is formed at block 604 in the substrate by selectively implanting a dopant of a first conductivity type. A variety of suitable implanting techniques can be employed such as diffusion and ion implantation. Continuing at block 606, a base region is formed within the collector region by selectively implanting a dopant of a second conductivity type. The second conductivity type is of an opposite conductivity than the first conductivity type.

Continuing on with block 608, a top region is formed in the base region by selectively implanting a dopant of the first conductivity type to a concentration such that the top region remains of the same conductivity type as the base region, the second type. Such a top region can also be referred to as a counter doped region. Additionally, such implantation of a dopant without changing the conductivity type can also be referred to as counter doping. The implantation for the top region is performed via ion implantation at a lower energy and/or velocity such that the top region is shallower than the base region. Furthermore, the top region is generally substantially shallower than the base region. This depth of the top region is selected so as to mitigate the impact of the top region on the beta value for the transistor device while improving and/or stabilizing the breakdown voltage between the emitter and the base regions. The dose for the dopant and the resulting concentration of the dopant can be selected so as to obtain a desired breakdown voltage for the bipolar transistor. Additionally, this top region can be performed with the same masking step (e.g., developed/undeveloped photoresist) as was utilized for formation of the base region.

Finally, an emitter region is formed within the base region by selectively implanting a dopant of the first conductivity type at block 608. The emitter region is formed a sufficient dosage of the dopant so as to be of the first conductivity type, unlike the top region.

A bipolar transistor device fabricated via method 600 can be an NPN type or PNP type transistor, depending on the conductivity types chosen for the first and second conductivity types. Additionally, as stated supra, the first conductivity type is opposite the second conductivity type. Thus, if the first conductivity type is n-type, the second conductivity type is p-type. Likewise, if the first conductivity type is p-type, the second conductivity type is n-type.

FIGS. 7–14 depict various exemplary stages of fabrication that illustrate fabrication of an exemplary bipolar transistor device in accordance with an aspect of the present invention. It is appreciated the present invention is not limited to the device illustrated nor is the present invention limited to the processes indicated and described.

Figure 7:
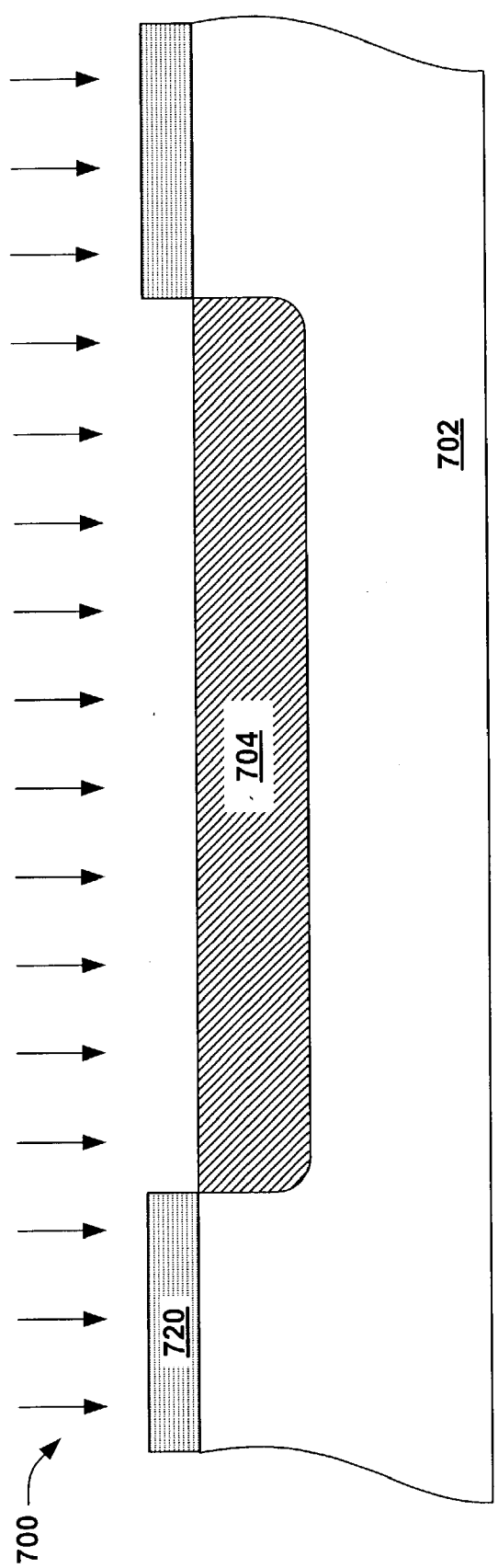
FIG. 7 is a cross sectional view of a bipolar transistor at a stage of fabrication in accordance with an aspect of the present invention.

FIG. 7 is a cross sectional view of a bipolar transistor device 700 at a stage of fabrication in accordance with an aspect of the present invention. The view is of a first stage of fabrication. An n-type dopant is implanted into a substrate 702 thereby forming a buried layer 704, which can be referred to as an n-type buried layer (NBL). The n-type dopant can be implanted by diffusion and/or ion implantation. A resist layer 720 or mask layer is employed to selectively control implantation of the n-type dopant for ion implantation. Alternately, an oxide layer can be used in place of the resist layer for diffusion implantation. Suitable n-type dopants that can be employed include antimony, arsenic, and phosphorous. The substrate 702 can, optionally, include doped and undoped wafers (e.g., silicon wafer, silicon wafer lightly doped with a p-type material, and the like) and typically consists of an upper surface of a wafer. The buried layer 704 is employed to form a channel that carries collector current of the transistor 700.

Figure 8:
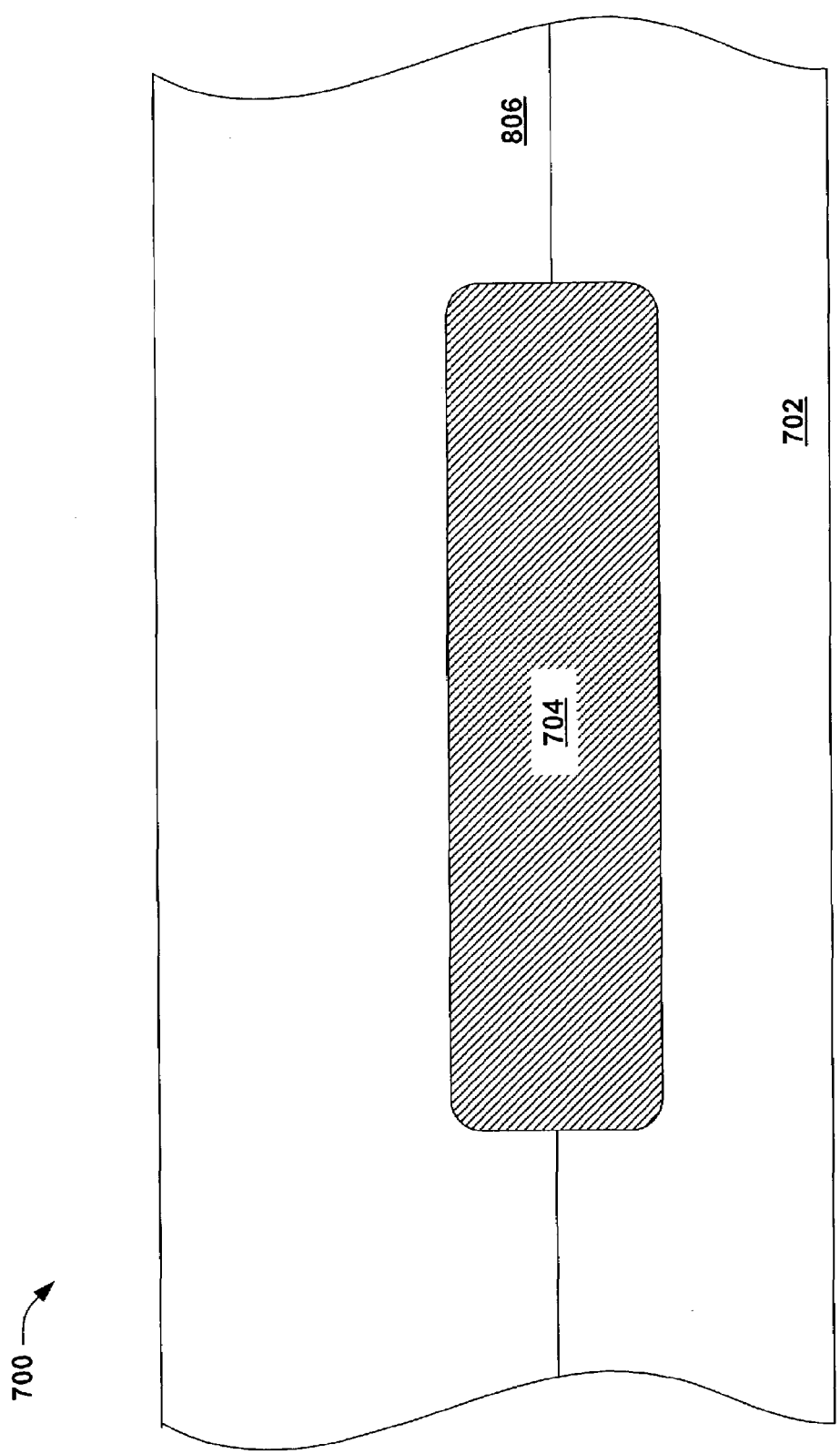
FIG. 8 is another cross sectional view of a bipolar transistor at a stage of fabrication in accordance with an aspect of the present invention.

FIG. 8 is a cross sectional view of a bipolar transistor device 700 at a stage of fabrication in accordance with an aspect of the present invention. An epitaxial layer 806 has been grown. The epitaxial layer 806 is grown by depositing atoms of a semiconductor material on a surface of the device 700 with sufficient energy to move around on the surface and orient themselves into the crystal arrangement of atoms at the surface. The epitaxial layer 806 is fabricated so as to be slightly p-type by depositing an amount of p-type material (e.g., boron atoms) along with the other deposited atoms. In addition to growing the epitaxial layer 806, the buried layer 704 also expands during the operation.

Figure 9:
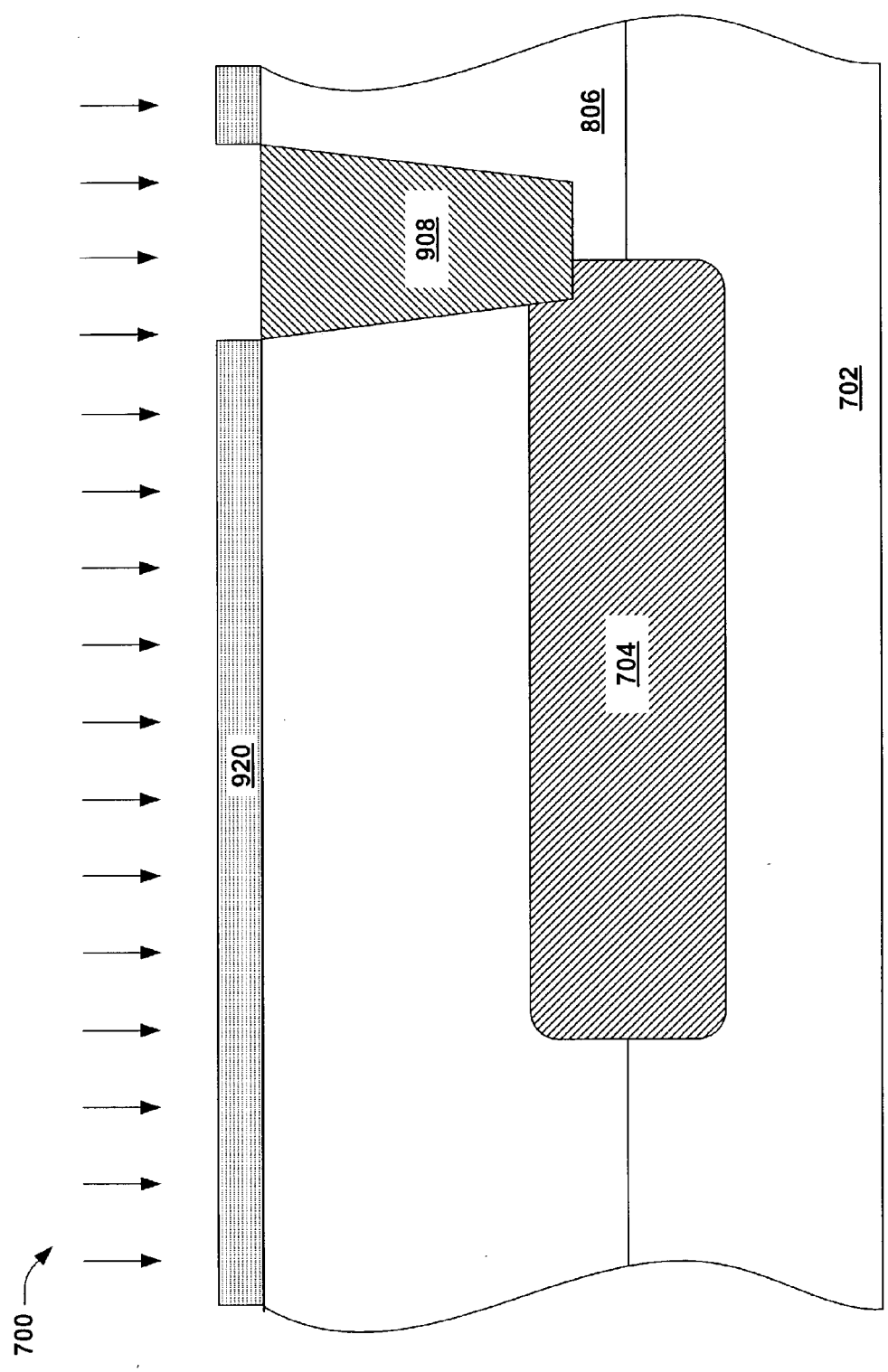
FIG. 9 is yet another cross sectional view of a bipolar transistor at a stage of fabrication in accordance with an aspect of the present invention.

FIG. 9 is another cross sectional view of the bipolar transistor device 700 at a stage of fabrication in accordance with an aspect of the present invention. Here, a deep collector region 908 has been formed in the epitaxial layer 806. The deep collector region 908 is typically formed by ion implantation of an n-type dopant such that it is highly conductive and yields a low resistance path the buried layer 704. A resist layer 920 or mask layer is employed to selectively control implantation of the dopant for ion implantation. Additionally, the deep collector region 908 is typically formed so as to be in contact with the buried layer 704.

Figure 10:
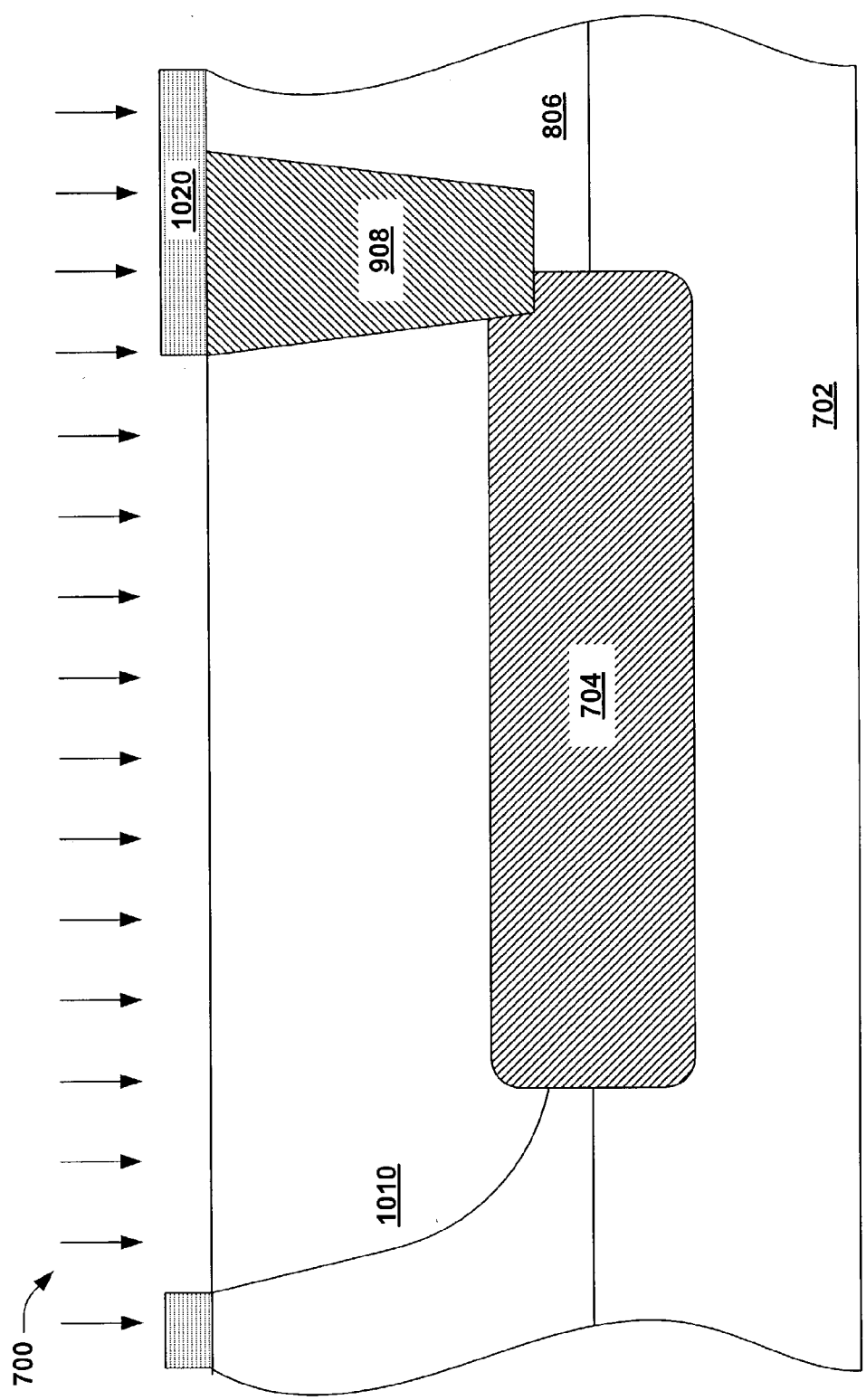
FIG. 10 is another cross sectional view of a bipolar transistor at a stage of fabrication in accordance with an aspect of the present invention.

FIG. 10 is yet another cross sectional view of the bipolar transistor device 700 at a stage of fabrication in accordance with an aspect of the present invention. This view depicts a collector region 1010 formed within the epitaxial layer in contact with the buried layer 704 and the deep collector region 908. An ion implantation process is utilized to implant an n-type dopant such as phosphor in order to form the collector region 1010. Areas or region of the device outside of the collector region 1010 can be masked prior to performing the ion implantation process to selectively control the dopant implantation. A resist layer 1020 or mask layer is employed to selectively control implantation of the. The collector region 1010 is formed so as to be of n-type conductivity.

Figure 11:
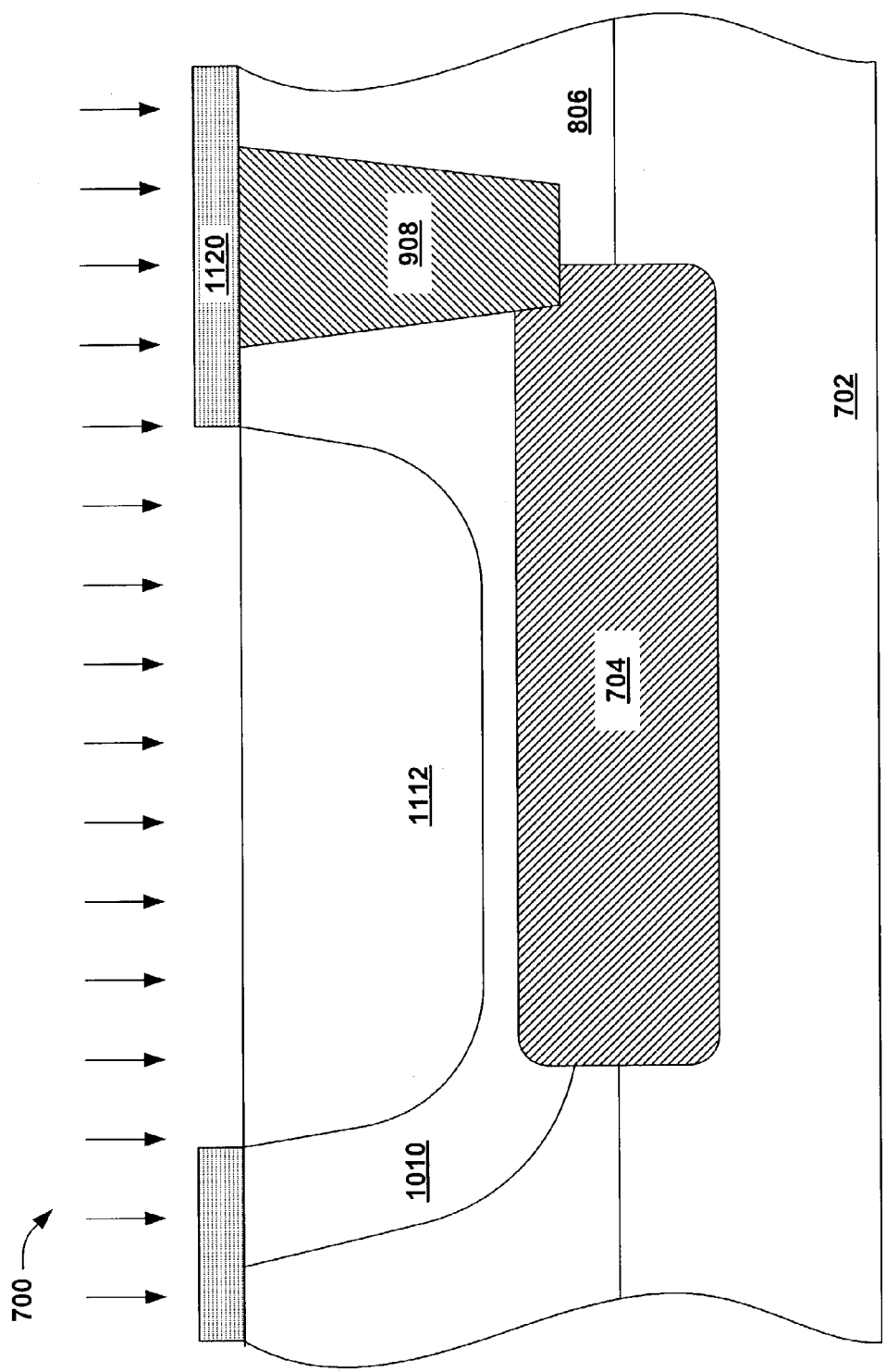
FIG. 11 is yet another cross sectional view of a bipolar transistor at a stage of fabrication in accordance with an aspect of the present invention.

Continuing with FIG. 11, another cross sectional view of the bipolar transistor device 700 at a stage of fabrication is depicted. In this view, a base region 1112 is illustrated as being formed within the collector region 1010. An ion implantation process is employed to implant a p-type dopant such as boron in order to form the base region 1112. The p-type dopant is implanted and diffused in such a way that the depth of the base region 1112 is less than that of the collector region 1010. Thus, the base region 1112 is shallower or less deep than the collector region 1010. Regions of the device outside of the base region 1112 can be masked to avoid implantation of the p-type dopant outside of the base region 1112. A resist layer 1120 or mask layer is employed to selectively control implantation of the dopant for ion implantation. The base region 1112 is formed so as to be of p-type conductivity.

Figure 12:
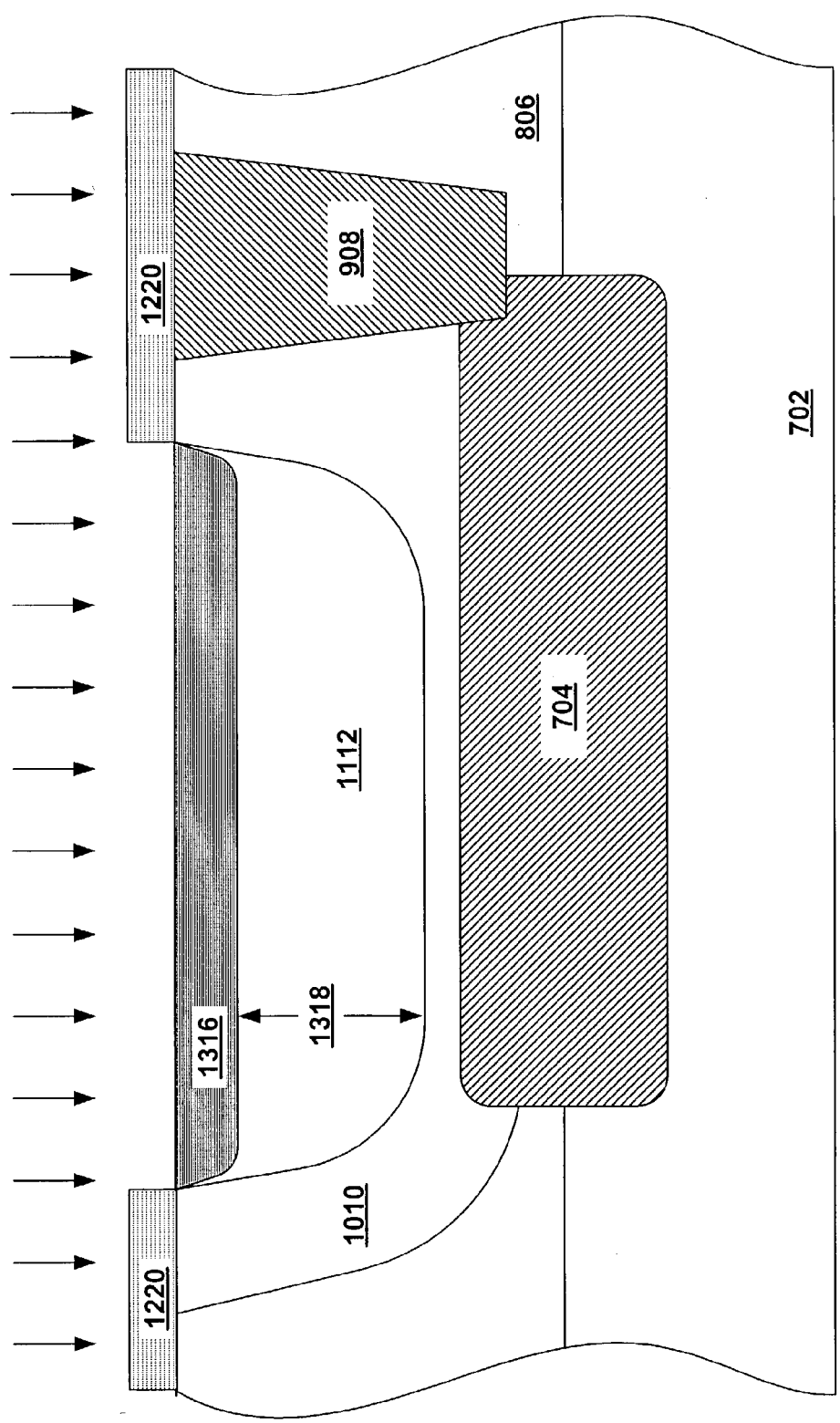
FIG. 12 is another cross sectional view of a bipolar transistor at a stage of fabrication in accordance with an aspect of the present invention.

FIG. 12 illustrates another cross sectional view of the bipolar transistor device 700 at a stage of fabrication. This view shows a top region 1316 of the base region 1112, which is formed by implanting an n-type dopant but yet remains of p-type conductivity. The top region 1316 can be formed with the same mask employed in formation of the base region 1112, thus avoiding a separate masking step. Additionally, the top region 1316 is a relatively shallow region and is formed by ion implantation at a lower energy and/or velocity than the ion implantation performed for forming the base region 1112. The top region 1316 can extend across all or substantially all of the surface of the base region 1112. Further, the top region 1316 is typically formed prior to formation of an emitter region, which avoids an additional masking step. The top region 1316 results in the electric field being lower near the surface of the base region causing the emitter-base breakdown voltage to increase near the surface. As such, a bottom portion 1318 of the base region 1112 substantially effects and determines a beta value for the transistor 700.

Figure 13:
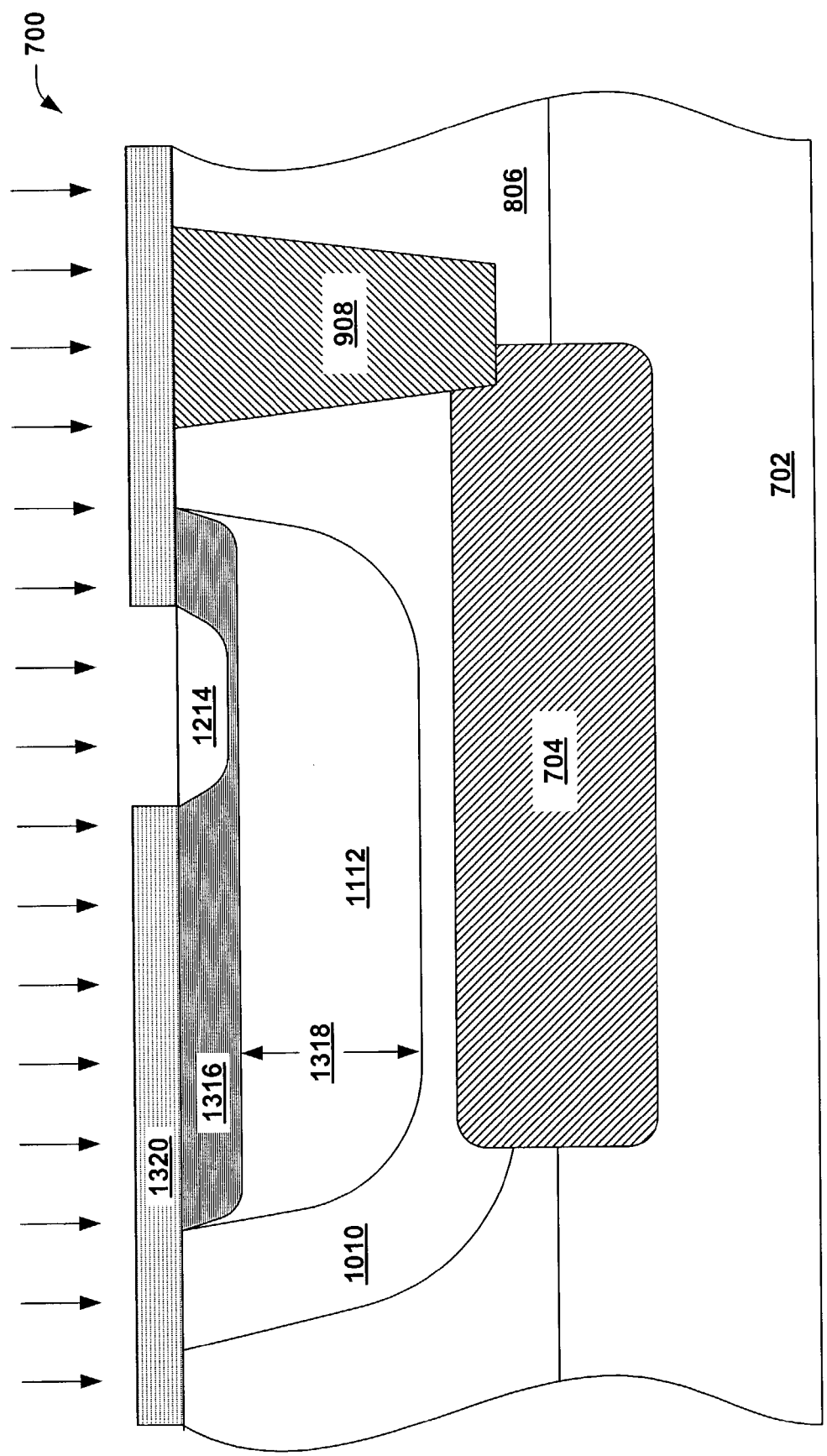
FIG. 13 is yet another cross sectional view of a bipolar transistor at a stage of fabrication in accordance with an aspect of the present invention.

Referring now to FIG. 13, yet another cross sectional view of the bipolar transistor device 700 at another stage of fabrication is illustrated. Here, an emitter region 1214 having n-type conductivity is formed within the base region 1112. Once again, ion implantation is utilized to implant an n-type dopant. Also, masking is again used to avoid implantation outside of the emitter region 1214. The n-type dopant is implanted with less energy and/or velocity than the dopant utilized to form the base region 1112. Thus, the emitter region 1214 is shallower or less deep than the base region 1112.

Figure 14:
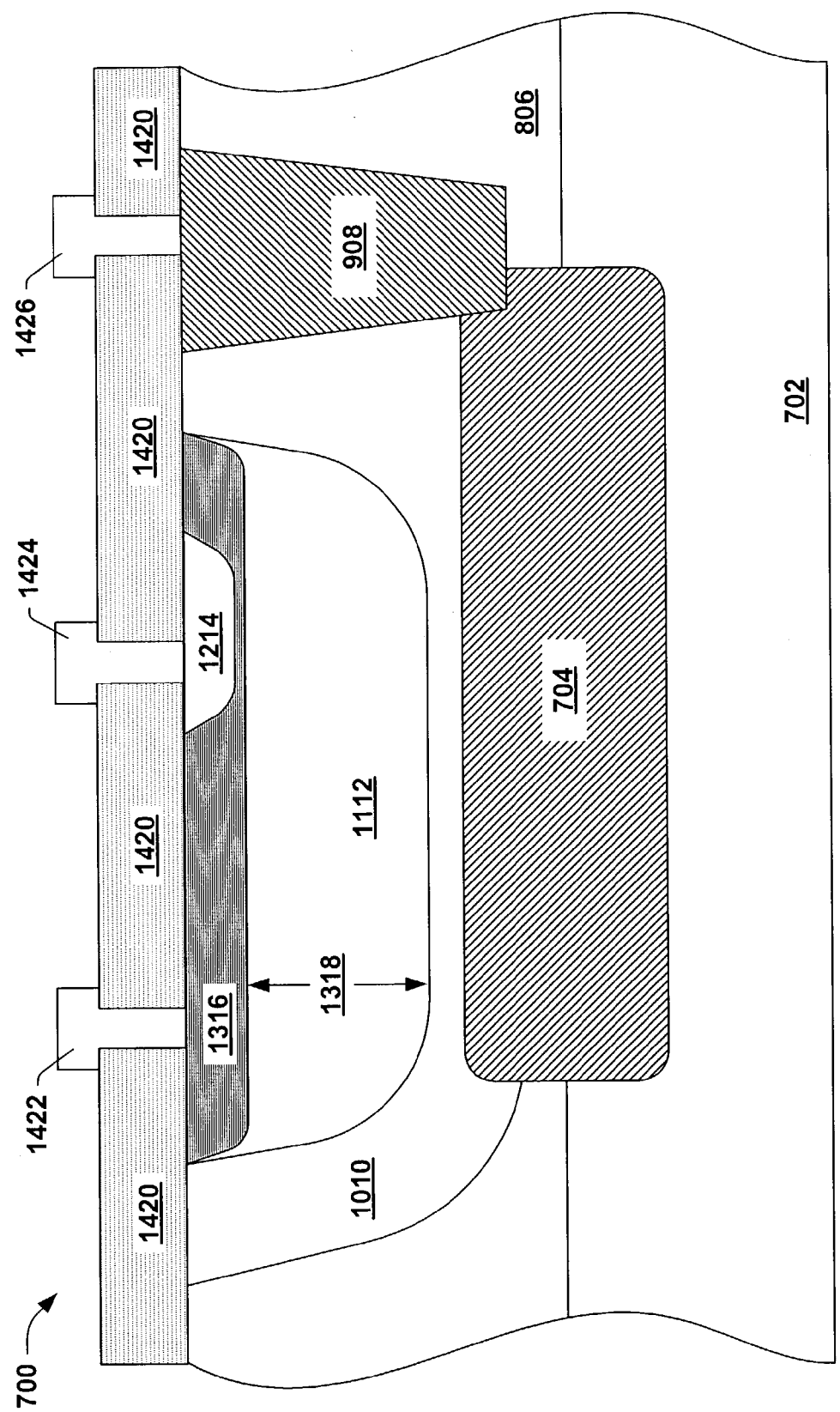
FIG. 14 is another cross sectional view of a bipolar transistor at a final stage of fabrication in accordance with an aspect of the present invention.

Finally, FIG. 14 depicts another cross sectional view of the bipolar transistor device 700 at a final stage of fabrication. Here, an oxide layer 1420, such as a metal layer oxide, is formed on the device and then patterned. Then, a base contact 1422, emitter contact 1424 and a collector contact 1426 are formed so as to provide electrical contact to the transistor 700. It is appreciated that other oxide layers, such as a field oxide, can also be formed and still be in accordance with the present invention.

As stated above, FIGS. 7–14 illustrate various exemplary stages of fabrication that illustrate fabrication of an exemplary bipolar transistor device in accordance with an aspect of the present invention. For illustrative purposes, not every stage of device fabrication has been illustrated and/or described. Additionally, some stages and/or processes have not been included with this description in order to facilitate a better understanding of the present invention.

Figure 15:
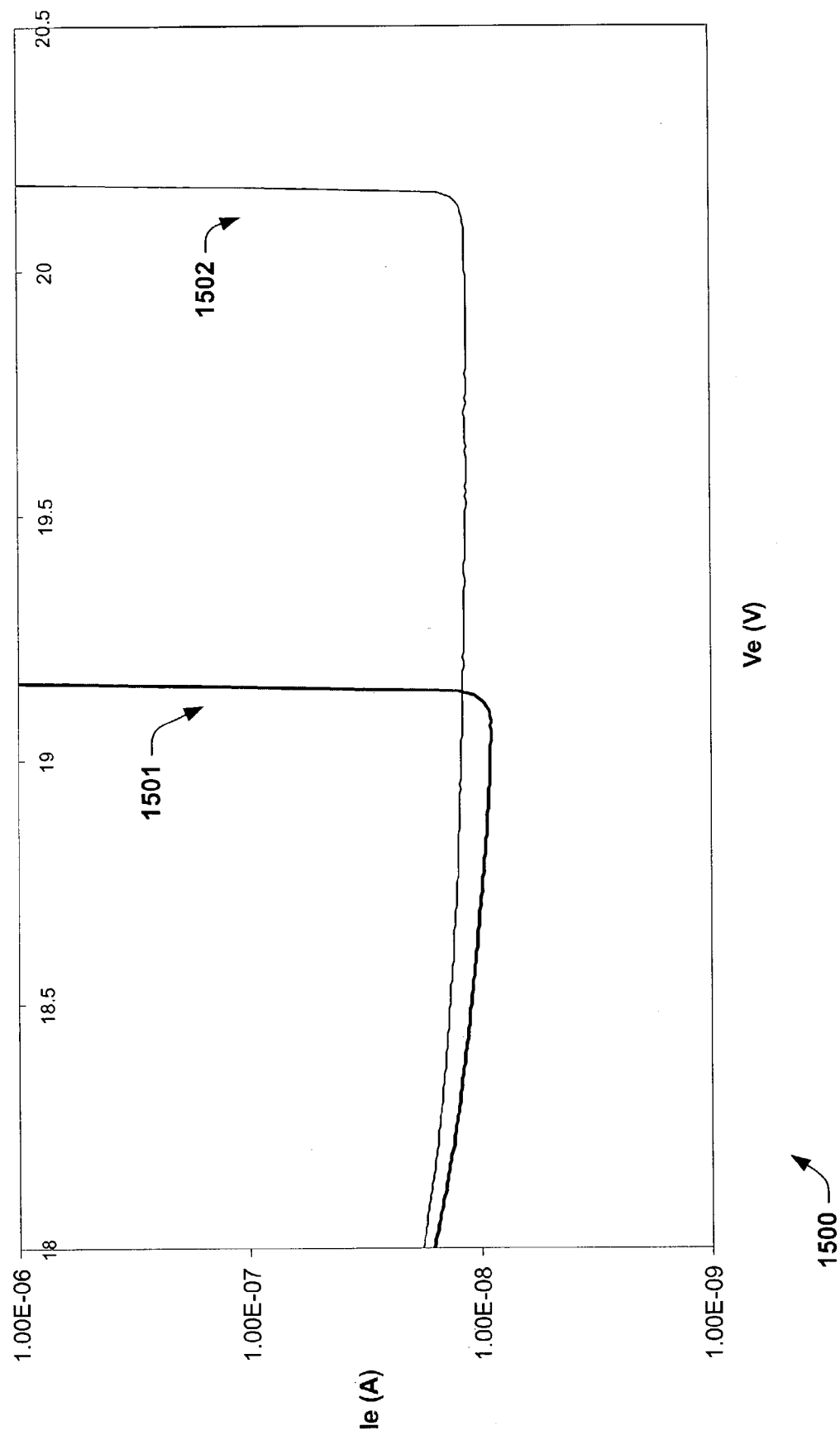
FIG. 15 is a graph illustrating performance characteristics of a conventional bipolar transistor compared with an exemplary bipolar transistor in accordance with the present invention.

FIG. 15 is a graph 1500 illustrating performance characteristics of a conventional bipolar transistor compared with a bipolar transistor of the present invention. The graph is based on experimental data and is provided for illustrative purposes only and is not intended to limit the present invention. The transistors are of type NPN. The x-axis provides an emitter-base voltage (Veb) and the y-axis provides a emitter current (Ie) corresponding to the emitter-base voltage. A first line 1501 illustrates a conventional bipolar transistor. Here, it can be seen that breakdown starts to occur when the emitter-base voltage rises to about 19.16 volts. The conventional bipolar transistor is fabricated without a top region or counter doped region.

A second line 1502 illustrates a bipolar transistor in accordance with the present invention. This transistor has been formed with a top region or counter doped region. The top region is formed with a counter dopant dosage of about $1\times10^{12}$ ions/cm$^2$ and a standard base dose of about $1\times10^{13}$ ions/cm$^2$ that results in a net majority carrier concentration of about $4.5\times10^{17}$ ions/cm$^3$. In contrast, the standard transistor base region is formed with only a standard base dosage of about $1\times10^{13}$ ions/cm$^2$, which results in a concentration of about $5\times10^{17}$ ions/cm$^3$ near the surface. Thus, for the transistor that results in line 1502, the breakdown voltage has improved to be about 20.18 volts. By comparison with the first line 1501, it can be seen that a bipolar transistor of the present invention yields a substantial improvement in emitter-base breakdown voltages.

Figure 16:
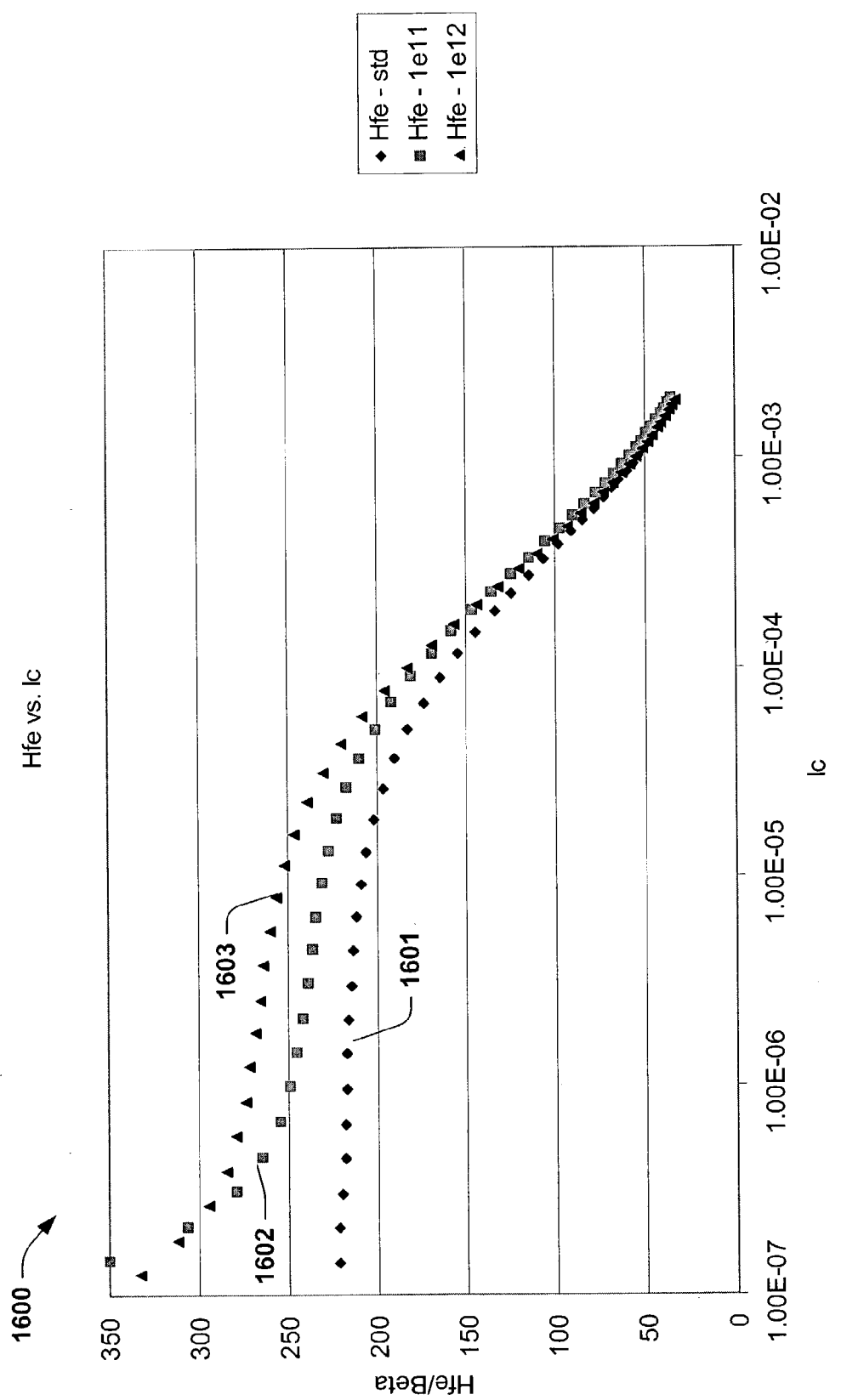
FIG. 16 is another graph illustrating performance characteristics of a conventional bipolar transistor compared with exemplary bipolar transistors in accordance with the present invention.

FIG. 16 is another graph 1600 illustrating performance characteristics of a conventional bipolar transistor compared with a bipolar transistor of the present invention. The graph is based on experimental data and is provided for illustrative purposes only and is not intended to limit the present invention. Both transistors are NPN type transistors.

The x-axis depicts collector current and the y-axis depicts beta/Hfe values. Line 1601 is for a conventional bipolar transistor wherein the base region has been formed via a dose of about $1\times10^{13}$ ions/cm$^2$ of a p-type dopant to yield a dopant concentration of about $5\times10^{17}$ ions/cm$^3$ near the surface of the base region.

Line 1602 illustrates operation of a first bipolar transistor in accordance with the present invention. A base region of the first bipolar transistor has been formed via a dose of about $1\times10^{13}$ ions/cm$^2$ of a p-type dopant to yield a dopant concentration of about $5\times10^{17}$ ions/cm$^3$ near the surface of the base region. Additionally, a top region near a surface of the base region has been counterdoped with an n-type dopant via a dose of about $1\times10^{11}$ ions/cm$^2$.

The counterdoping of the top region results in increasing a breakdown voltage for the first bipolar transistor as compared with the conventional bipolar transistor depicted in line 1601. It is appreciated that the counterdoping of the top region has not negatively impacted the Hfe/beta value for the first transistor. In fact, the Hfe/beta value for the first transistor is improved in comparison to the conventional bipolar transistor of line 1601.

Line 1603 illustrates operation of a second bipola(transistor in accordance with the present invention. A base region of the first bipolar transistor has been formed via a dose of about $1\times10^{13}$ ions/cm$^2$ of a p-type dopant to yield a dopant concentration of about $5\times10^{17}$ ions/cm$^3$ near the surface of the base region. And, once again, a top region near a surface of the base region has been counterdoped with an n-type dopant via a dose of about $1\times10^{12}$ ions/cm$^2$. This top region, as a result of the counterdoping, has a dopant concentration of about $4.5\times10^{17}$ ions/cm$^3$.

As with the first bipolar transistor, the top region of the second bipolar transistor depicted in line 1603 has not negatively impacted the Hfe/beta value for the second transistor. And, once again, the Hfe/beta value is improved for some collector current values. Further, the counterdoping of the top region of the second bipolar transistor results in increasing a breakdown voltage for the second bipolar transistor as compared with the conventional bipolar transistor depicted in line 1601, and even the first bipolar transistor 1602. The increase in breakdown voltage as compared with the first bipolar transistor is due to the higher dose employed in formation of the top region of the second bipolar transistor.

Semiconductor devices of the present invention and methods of the present invention can be employed in a wide variety of computer and electronic devices such as computers, appliances, industrial equipment, hand-held devices, telecommunications equipment, medical equipment, research and development equipment, transportation vehicles, radar/satellite devices, and the like. Handheld devices, and particularly hand-held electronic devices, achieve improvements in portability due to weight reductions and/or increased computing capacity (e.g., increased processing power and memory storage). Examples of hand-held devices include cell phones and other two way communication devices, personal data assistants, palm pilots, pagers, notebook computers, remote controls, recorders (video and audio), radios, small televisions and web viewers, cameras, and the like.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of fabricating a bipolar transistor device comprising:
    selectively implanting a dopant of n-type conductivity in a substrate;
    growing an epitaxial layer on the substrate and diffusing a portion of the implanted n-type dopant into the epitaxial layer forming a buried layer, the buried layer being n-type;
    selectively implanting a dopant of n-type conductivity into the epitaxial layer forming a deep collector, the deep collector being n-type;
    selectively implanting a dopant of n-type conductivity into the epitaxial layer forming a collector region, the collector region being n-type;
    selectively implanting a dopant of p-type conductivity within the collector region forming a base region, the base region being p-type, wherein selectively implanting the dopant of p-type conductivity to form the base region comprises performing ion implantation at a first energy/velocity and a first dose;
    selectively implanting a dopant of n-type conductivity within the base region forming a top region at a surface of the base region, the top region remaining p-type; wherein selectively implanting the dopant of n-type conductivity within the base region forming the top region comprises performing ion implantation at a second velocity and a second dose, the second velocity being about one-third that of the first velocity and the second dose being less than the first dose; and
    selectively implanting a dopant of n-type conductivity within the base region forming an emitter region, the emitter region being n-type.

2. The method of claim 1, wherein selectively implanting the dopant of p-type conductivity within the base region forming the top region encreases resistance within the top region.

3. The method of claim 1, further comprising forming isolation regions over the epitaxial layer.

4. A method of fabricating a bipolar transistor comprising:
    forming a collector region in a substrate;
    forming a base region within the collector region, the base region being of a first conductivity type and having a dopant concentration profile associated therewith;
    after forming the collector region and the base region, forming a top region within the base region by counterdoping, the top region being of the first conductivity type, the top region reducing a gradient associated with the dopant concentration profile, wherein forming the base region and forming the top region are performed during a single masking operation; and
    after said counterdoping, forming an emitter region within the base region, the emitter region being of a second conductivity type.

5. The method of claim 4, further comprising performing an additional masking operation after forming the top region and prior to forming the emitter region.

6. A method of fabricating a bipolar transistor device comprising:
    forming a collector region in a substrate;
    then, forming a base region within the collector region, the base region being of a first conductivity type, the base region having a top region at a surface of the base region and a bottom portion below the top region;
    then, reducing a dopant concentration of the top region of the base region, wherein the steps of forming a base region and reducing a dopant concentration of the top region are performed during a single masking operation;
    forming an emitter region within the base region, the emitter region being of a second conductivity type.

7. The method of claim 6, wherein reducing the dopant concentration of the top region comprises counterdoping the top region with a dose of a dopant having an opposite conductivity to that of the base region to obtain a desired breakdown voltage, the desired breakdown voltage corresponding to the dose of the dopant.

8. The method of claim 6, wherein reducing the dopant concentration of the top region comprises reducing the dopant concentration of the top region by about 10 percent.

9. The method of claim 6, wherein the bottom portion of the base region is formed with a peak dopant concentration of about $5\times10^{16}$ ions/cm$^3$.

10. The method of claim 6, wherein prior to reducing the dopant concentration of the top region, the top region is formed with a dopant concentration of about $5.0\times10^{17}$ ions/cm$^2$.

11. The method of claim 10, wherein reducing the dopant concentration of the top region reduces the dopant concentration to about $4.5\times10^{17}$ ions/cm$^2$.

12. The method of claim 6, wherein the base region is formed via ion implantation with a dose of about $1\times10^{13}$ ions/cm$^2$ of a p-type dopant to yield a dopant concentration of about $5\times10^{17}$ ions/cm$^3$ near the surface of the base region.

13. The method of claim 12, wherein the dopant concentration is reduced by counterdoping the top region via ion implantation with a dose of about $1\times10^{12}$ ions/cm$^2$ of an n-type dopant to reduce the dopant concentration to about $4.5\times10^{17}$ ions/cm$^3$.

* * * * *